United States Patent [19]

Leopold et al.

[11] Patent Number: 5,351,010
[45] Date of Patent: Sep. 27, 1994

[54] RESISTANCE RATIO MEASUREMENT UTILIZING MEASURING CURRENTS OF OPPOSITE PLURAL DIRECTION

[75] Inventors: Hans Leopold, Sonnleitenweg 17, A-8043 Graz; Hans Stabinger, Peterstalstrasse 156, A-8042; Klaus P. Schröcker, all of Graz, Austria

[73] Assignees: Hans Leopold; Hans Stabinger, Graz, Austria

[21] Appl. No.: 928,483

[22] Filed: Aug. 14, 1992

[30] Foreign Application Priority Data

Aug. 16, 1991 [AT] Austria .................. 1623/91

[51] Int. Cl.$^5$ .......................................... G01R 27/14
[52] U.S. Cl. .................. 324/704; 324/713; 374/172; 374/183
[58] Field of Search .............. 324/693, 699, 704, 705, 324/713, 716; 73/766; 374/114, 163, 172, 183, 185

[56] References Cited

U.S. PATENT DOCUMENTS

| | | | |
|---|---|---|---|
| 3,447,075 | 5/1969 | Williams et al. | 324/705 |
| 4,114,446 | 9/1978 | Walsh | 374/173 |
| 4,814,692 | 3/1989 | Baumann | 324/704 |
| 5,171,091 | 12/1992 | Krüger et al. | 374/183 |

FOREIGN PATENT DOCUMENTS

| | | |
|---|---|---|
| 0120102 | 10/1984 | European Pat. Off. . |
| 0173833 | 7/1985 | European Pat. Off. . |
| 3714165 | 11/1988 | Fed. Rep. of Germany . |

OTHER PUBLICATIONS

Taylor et al., "A Microcomputer–Based Instrument for Application in Platinum Resistance Thermometry", Journal of Physics E. Scientific Instruments, Bd. 16, Nr. 11, Nov. 1983 Bristol GB, Seiten 1100–1104.

Schlenk, "Präzise Erfassung Quasistatischer Messwerte Nach Dem Doppelstrom–Messverfahren," Messen+-Prufen, Nr. 9, Sep. 1980, Bad Worishofen de Seiten 590–595.

Patent Abstracts of Japan, vol. 9, No. 296, Nov. 1985.

Primary Examiner—Kenneth A. Wieder
Assistant Examiner—Christopher M. Tobin
Attorney, Agent, or Firm—Cushman, Darby & Cushman

[57] ABSTRACT

An apparatus and method for determining a characteristic of a resistor and/or an environment occurring as a voltage across a measuring resistor (e.g., a voltage across a temperature-dependent resistor) by comparing it with a reference value that occurs as a voltage across a reference resistor (e.g., a voltage across a temperature-stabilized reference resistor) to determine, for example, temperature. A total of four voltages are measured. That is, positive and negative currents are passed through the measuring resistor and the resulting first and second voltages across the measuring resistor are detected. Positive and negative currents then are passed through the reference resistor and the resulting third and fourth voltages across the reference resistor are detected. The difference between the first and second voltage and the third and fourth voltages is determined to eliminate the effect of thermo-electric voltages in the lines to the resistors and the lines of the contact terminals in the switches. From these differences, a quotient is calculated that represents the characteristic of the measuring resistor and the environment.

11 Claims, 5 Drawing Sheets

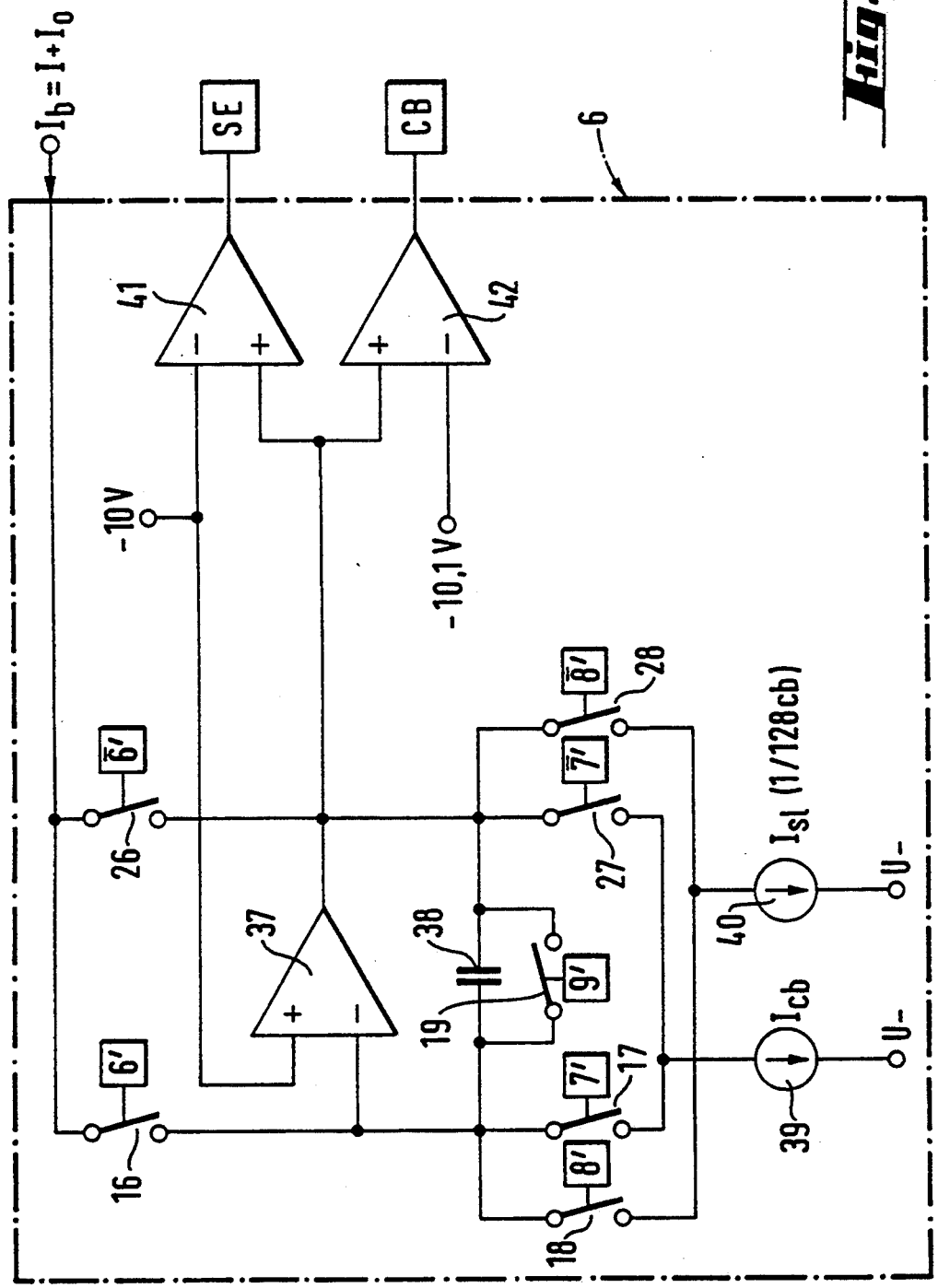

RESISTANCE RATIO MEASUREMENT UTILIZING MEASURING CURRENTS OF OPPOSITE PLURAL DIRECTION

BACKGROUND OF THE INVENTION

1. Field of the Invention

This invention relates to a method and apparatus for determining the value of a measurable quantity that can be represented as a voltage across a measuring resistor by comparing it with a reference value that can be represented as a voltage across a reference resistor. Using this method and apparatus, resistance ratios can be measured and, for example, to measure temperature, the voltage across a temperature-dependent measuring resistor and the voltage across a temperature-stabilized reference resistor are determined and a quotient is calculated that represents the measurable quantity.

2. Description of the Art

European Patent EP-A 0120102 discloses a thermometer that performs four measurements of voltages across a total of three resistors (e.g., one measuring and two reference resistors) for each temperature measurement. The apparatus determines a difference between a voltage across the measuring resistor and a voltage across the first reference resistor and further determines a difference between a voltage across the second reference resistor and a voltage across the first reference resistor, and calculates the temperature from these values. This process requires two reference resistors and eliminates undesirable effects due to the amount of the measured current, the offset error, and the gain error of a measuring amplifier. However, errors caused by thermoelectric voltages in the measuring circuits and those caused by contact voltages from change-over circuits are not eliminated.

SUMMARY OF THE INVENTION

An object of the present invention is to eliminate the effects of the thermo-electric voltages present in the feeders to the individual resistors and in the contact terminals in the switches. This invention measures drops in voltage for the following four conditions:

I. positive measuring current is passed through the measuring resister,

II. negative measuring current is passed through the measuring resistor,

III. the positive measuring current is passed through the reference resistor, and IV. the negative measuring current is passed through the reference resistor.

The difference of the first and second measurable quantities (i.e., condition I and II) and the difference of the third and fourth measurable quantities (i.e., condition III and IV) are determined and the quotient of these two differences calculated.

By using this process, it is possible to eliminate the offset error and the gain error even if the values of the positive and negative measuring current are not the same. Linearity errors can remain, but they can be sufficiently reduced by using high quality amplifiers and an incremental A/D converter procedure.

A further feature of the invention concerns the ability of transforming the voltages across the measuring and reference resistors caused by the measuring current into proportional imaging current. The advantage of this approach is that an A/D converter in the current domain can be used to achieve a higher dynamic range than is achievable in the voltage domain. Furthermore, the imaging current can be converted into a number in which the following procedural steps can be carried out sequentially:

a) The imaging current is integrated during a prescribed measuring period, e.g., 100 ms. This prescribed measuring period is divided, for example, into 100 sub-periods, whereby each sub-period is divided into 1000 timing periods. The integrator performing the integration is set to a prescribed initial reference value before integration has begun, and the integration begins and ends at the beginning of a timing period. During the first sub-period (1000 timing periods), only the imaging current is integrated.

b) During the second sub-period and each sub-period thereafter, in addition to integrating the imaging current, an initial compensating current is integrated. The initial compensating current has a fixed prescribed value which is larger than the largest of each occurring imaging current and has a polarity opposite to that of the imaging current. The integration of the initial compensating current occurs from the beginning of the second sub-period and each sub-period thereafter until the value of the integral achieves a fixed predetermined second reference value. Then, the number of time periods that have elapsed for these integrations during all of the sub-periods are added.

c) From the end of the last sub period, only the initial compensation current is integrated until the integral reaches the second reference value. The number of time periods elapsed during this integration is added to the total number resulted from the sub-periods.

d) Thereafter, the integration of a second compensating current amounting to a precisely defined fraction of the initial compensation current takes place until the integral reaches the initial reference value. The number of time periods elapsed during this integration is weighted by the fraction mentioned above and then added to the total.

A further objective of the invention is to provide an apparatus to perform the above process. An apparatus according to this invention comprises a measuring resistor and a reference resistor coupled to two current sources for generating positive and negative measuring current and analyzing circuitry preferably comprising electronic switches. The analyzing circuitry comprises a voltage/current converter and an analog/digital converter coupled thereto. Both can be activated by a control and analysis logic circuit that controls the signals for the circuits and operates in accordance with signals provided by a clock generator.

The connecting point of the measuring and the reference resistors is coupled to a ground. Four electronic switches are coupled to the positive and negative current sources and further to the measuring and reference resistors. Four additional electronic switches are alternately coupled to the measuring and reference resistors and are further coupled to the inputs of a voltage/current converter. In this way, the voltage across the measuring and reference resistors can be detected and analyzed.

The voltage/current converter can be designed to comprise two operational amplifiers. Both operational amplifiers operate as voltage followers whose inputs can be coupled to the measuring and reference resistors through the switches and whose outputs can be coupled to a resistor. An output of one of the voltage followers is coupled to the resistor through a field effect transistor, and is further coupled through the field effect transistor to an offset current source to generate a unipolar imaging current. As a result of this design, an offset current and a measuring current proportional to the input voltage of the voltage/current converter flow through the resistor. Also, the field effect transistor assures that none of these currents can flow into the output of the operational amplifier. Furthermore, because a constant positive offset current is added to the measuring current, the output current (measuring current and offset current) of the voltage/current converter is prevented from becoming negative.

The analog/digital converter comprises an operational amplifier coupled to a negative feedback capacitor which acts as an integrator. The unipolar imaging current and a first and second compensating current can be provided to the input of the operational amplifier via electronic switches. The output of the integrator is coupled to two voltage comparators which output first and second reference values of the integral.

The use of the current provided by the A/D converter as a signal parameter realizes the following advantages:

1) In the current domain, the ratio of the upper overload level to the noise level in operational amplifiers is greater than in the voltage domain, and 2) it is quite possible to achieve currents having a relative error of approximately $10^{-7}$ (100 pA/1 mA) using off-the-shelf junction field effect transistors.

In summary, using the configurations of the invention as shown above, such as voltage/current converters and A/D converters used in the current domain, the precision of the resistance measurement improves to better than 1 ppm.

BRIEF DESCRIPTIONS OF THE DRAWINGS

FIG. 2b shows the circuitry for driving the operational amplifiers as shown in FIG. 2a.

FIG. 3 illustrates the circuitry of the analog/digital converter.

DETAILED DESCRIPTION OF THE PREFERRED EMBODIMENTS

Figure 1:
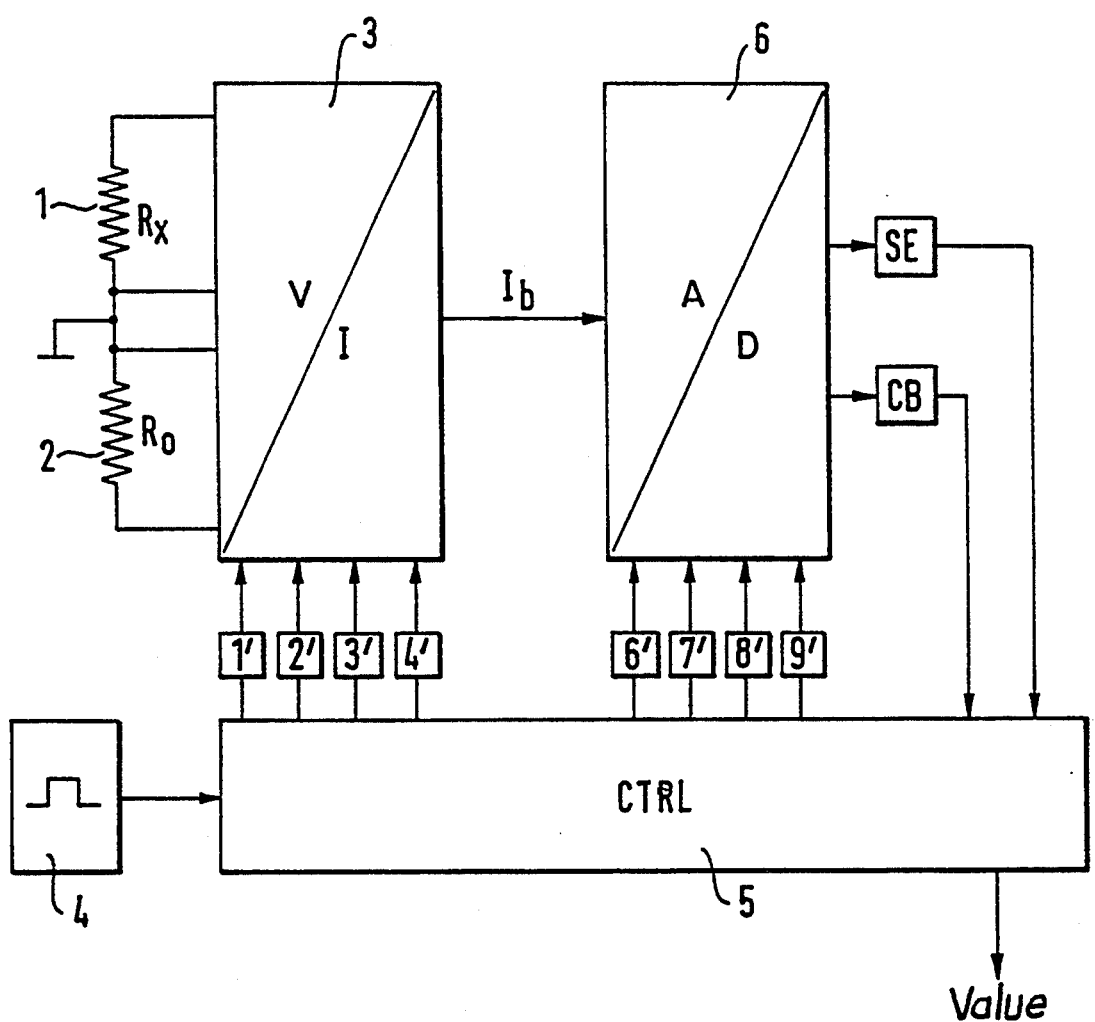
FIG. 1 illustrates a block diagram of the measuring apparatus of the present invention.

FIG. 1 is a block diagram of the present invention which is designed to measure temperature. The invention is not, however, limited to measuring temperature, but rather the invention can also be used, for example, to take highly precise measurements of resistance and resistance ratios.

One measuring resistor 1 (Rx) and one standard resistor 2 (Ro) are coupled to a V/I (voltage/current) converter 3 by a four-lead connection. Positive and negative measuring currents are alternately applied to both resistors and each time, the voltage across each respective resistor is converted into an individual imaging current Ib.

The four available variable measuring currents are generated by electronically controllable circuits in the V/I converter governed by control signals 1' through 4' and their binary complements 1'–4'. These control signals are generated by control and analysis logic circuit 5 which is driven by the pulsing signal provided by clock generator 4.

An analog/digital converter 6 is coupled to the V/I converter 3 and is controlled by control signals 6' through 9' and their binary complements 6' through 9' which are generated by the control and analysis logic circuit 5. The analog/digital converter 6 converts the imaging current Ib entering the analog/digital converter 6 to two logic signals SE and CB. The logic signals SE and CB are processed by the control and analysis logic circuit 5 to generate the digital value of the imaging current. Hence, the temperature value, for example, represented by signal "Value", can be determined.

Figure 2A:
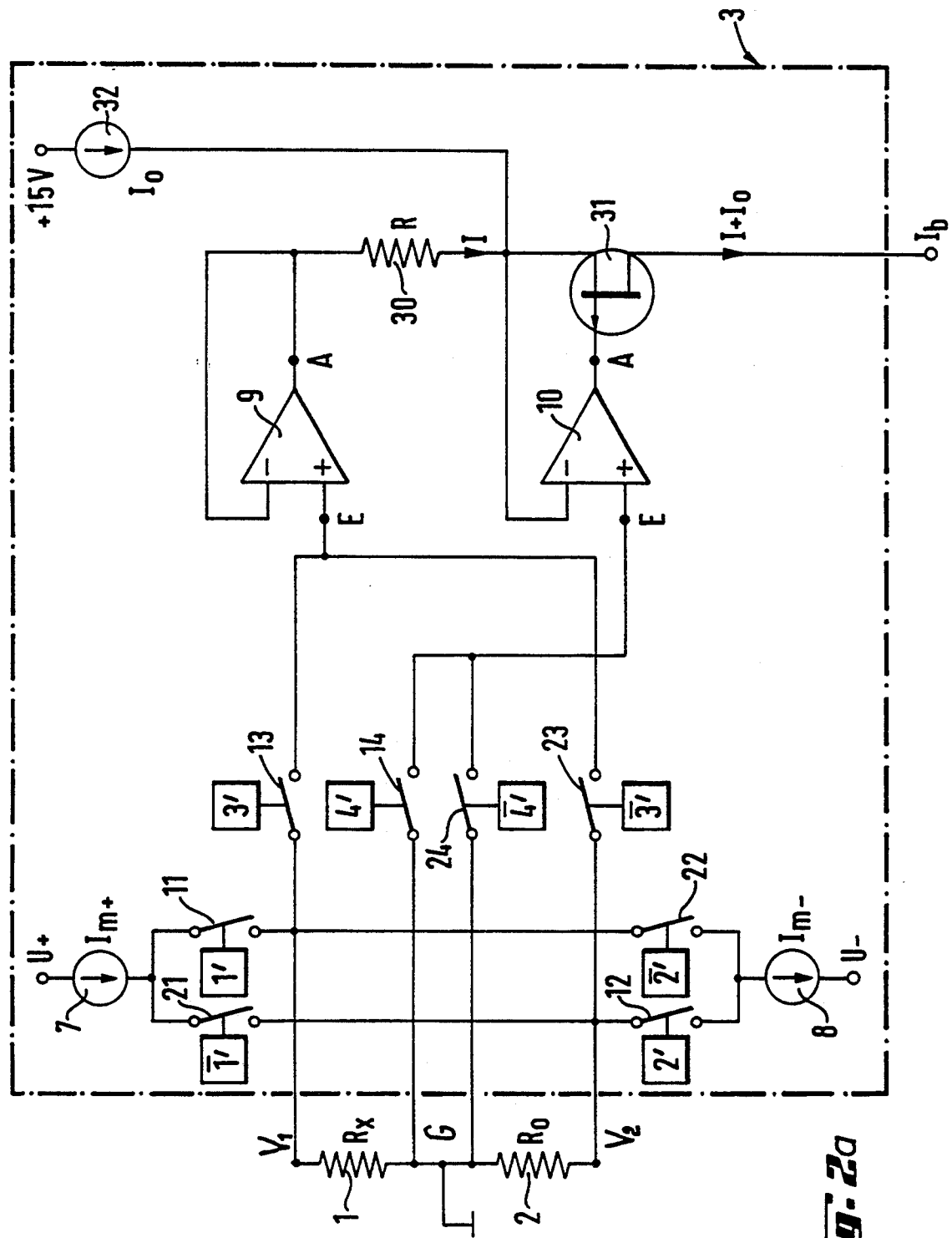
FIG. 2a shows the voltage-current converter of the measuring apparatus of FIG. 1.

FIG. 2a shows the voltage-current (V/I) converter 3 according to the present invention.

The measuring resistor 1 (Rx) is coupled to ground. A second terminal of resistor 1 alternately can be coupled to either the first measuring current source 7 that delivers a positive measuring current Im+ via an electronically-controlled switch 11 operated by control signal 1', or to a second measuring current source 8 that enables a measuring current Im− to flow via a second electronically-controlled switch 22 operated by the control signal negative 2' (−2'). Preferably, the current sources 7 and 8 are designed so that the amount of measuring currents Im+ and Im− are both the same amount, for example, 0.5 mA. However, this invention is not restricted to this design. Alternatively, the invention can be realized when the values of both measuring currents differ.

The first terminal of reference resistor 2 (Ro) is coupled to ground. The second current connection can selectively be connected to the first measuring current source 7 via a third controllable switch 21 controlled by the control signal negative 1' (1') or to the second measuring current source S via a fourth switch 12 controlled by control signal 2'.

A resistor with a precisely defined resistance-temperature characteristic (e.g., a platinum resistor) is preferably used as temperature-dependent measuring resistor 1. Since the temperature dependency of the reference resistor 2 can interfere with the measurement, its is desirable that the reference resistor have a thermostat or that it be maintained at a constant temperature with a Peltier element.

The first and second terminals of the measuring resistor 1 are coupled to controllable switches 14 and 13, respectively, which are controlled by control signals 3' and 4'. Controllable switches 13 and 14 are further coupled to the positive inputs of the operational amplifiers 9 and 10, respectively. The first and second terminals of the reference resistor 2 are coupled to the controllable switches 24 and 23 respectively, which are controlled by control signals negative 3' (−3') and negative 4' (−4).

A resistor 30 (R) has a first terminal coupled to the output and negative input of the first operational amplifier 9. The second terminal of resistor 30 is coupled to the negative input of the second operational amplifier 10. The output of the second operational amplifier 10 is coupled to the gate of a field effect transistor 31 whose source is coupled to the second terminal of resistor 30 and to the negative input of operational amplifier 10. The drain of field effect transistor 31 serves as the output of the V/I converter.

By arranging both operational amplifiers as voltage followers, the voltage across resistor 30 is equal to the voltage between both positive inputs of the operational amplifiers 9 and 10. Therefore, the current I that flows through resistor 30 is proportional to the voltage between both positive terminals of the operational amplifiers 9 and 10. Also, to assure that none of this current flows into the output of operational amplifier 10, the FET 31 is used. An offset current Io generated by current source 32 is forced into the source terminal of FET 31 preventing the current through the channel of FET 31 to become negative if the voltage between the positive inputs of the operational amplifiers 9 and 10 is negative.

For every temperature measurement, a total of four voltage measurements are made as follows:

Measurement 1

Switches 11, 13, and 14 are closed by control signals 1', 3' and 4' respectively, so that the positive measuring current Im+ flows through measuring resistor 1. The voltages at points V1 and G1 are provided to the non-inverting (positive) inputs of the operational amplifiers 9 and 10, respectively, via the voltage connections and the closed switches 13 and 14, respectively. The difference between the voltage at the positive inputs E of operational amplifiers 9 and 10 appears across resistor 30 and the first measuring current I is generated. First measuring current I combines with offset current Io and is output as imaging current Ib. Errors which occur during this measurement are due essentially to the offset voltages of the switches and the operational amplifiers as well as the thermo-electric voltages.

Measurement 2

Switches 13, 14 and 22 are closed by control signals negative 2' (−2'), 3' and 4', and thus negative measuring current Im− passes through the measuring resistor 1. Similar to measurement 1, the voltages at points V1 and G1 are provided to the non-inverting (positive) inputs of the operational amplifiers 9 and 10, respectively, via the voltage connections and the closed switches 13 and 14, respectively. The difference between the voltage at the positive inputs E of operational amplifiers 9 and 10 appears across resistor 30 and a negative measuring current I is generated. Negative measuring current I combines with the offset current Io and is output as imaging current Ib. Switches 13 and 14, the operational amplifiers, and their thermal voltages cause the same type of offset error as in measurement 1.

Measurement 3

Switches 21, 23 and 24 are closed by the control signals negative 1' (−1'), negative 3' (−3'), and negative 4' (−4'), and thus positive measuring current Im+ passes through the reference resistor 2 via the closed switch 21. The voltages at point V2 and G2 are provided to the non-inverting (positive) inputs of operational amplifiers 9 and 10, respectively, via the closed switches 23 and 24, respectively. The difference between the voltage at the positive inputs E of operational amplifiers 9 and 10 appears across resistor 30 and a measuring current I is generated. Measuring current I combines with the offset current Io and is output as imaging current Ib. The errors occurring during this measurement result from the offset voltages of switches 23 and 24 and the two operational amplifiers as well as the thermo-electric voltages.

Measurement 4

Switches 12, 23 and 24 are closed by the control signals 2', negative 3' (−3') and negative 4' (−4') and the negative measuring current Impasses through the reference resistor 2. The voltages at point V2 and G2 are provided to the non-inverting (positive) inputs of operational amplifiers 9 and 10, respectively, via the closed switches 23 and 24, respectively. The difference between the voltage at the positive inputs E of operational amplifiers 9 and 10 appears across resistor 30 and a negative measuring current I is generated. Negative measuring current I combines with offset current Io and is output as Ib. Errors resulting from this measurement correspond to those arising during the third measurement.

These four measurements are analyzed in the control and analysis logic 5, wherein the difference between the first and second and the third and fourth measurements are determined, namely:

$$(Im+)Rx - (Im-)Rx \text{ and } (Im+)Ro - (Im-)Ro \quad (1)$$

In determining the differences, the offset errors are eliminated. Finally, the quotient $$\frac{(Im+)Rx - (Im-)Rx}{(Im+)Ro - (Im-)Ro} \quad (2)$$

is determined from the two differences, thereby also eliminating the gain error.

In order to increase the precision of the converter, it is advantageous that both the positive measuring current Im+ and the negative measuring current Im− as well as the offset current Io be provided by a single current source. This type of circuitry conforms to state-of-the-art technology and is used, for instance, in the design of integrated operational amplifiers.

Figure 2B:
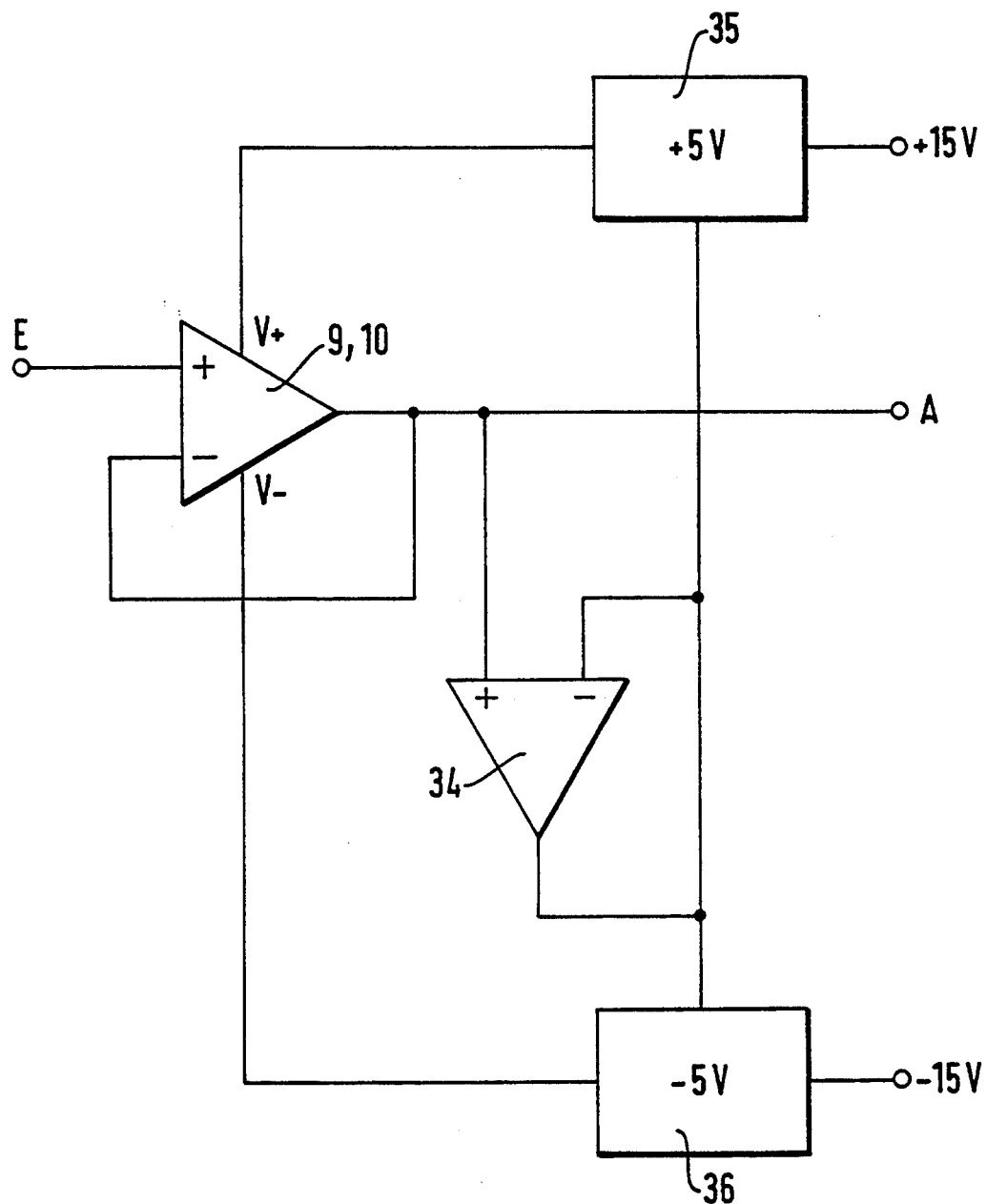

Since the analyzed voltage differences lie within the range of $10^{-7}$ V, high-precision operational amplifiers are used for both voltage follower operational amplifiers 9 and 10. Additionally any common mode and power supply errors are avoided with auxiliary circuitry to keep the operational amplifiers supplied with operating voltages that are referenced to the input voltage. Such auxiliary circuitry is proposed for either of the operational amplifiers as shown in FIG. 2b.

The input of an auxiliary voltage follower 34 is coupled to the output of the high-precision operational amplifier 9 or 10. The output of the auxiliary voltage follower 34 tracks the output potential of operational amplifier 9 or 10. The ground connections of the two voltage stabilizing circuits 35 and 36 are coupled to the output of the auxiliary voltage follower. The inputs of voltage stabilizing circuits 35 and 36 are supplied with +15 V and −15 V, respectively.

Since the voltage stabilizing circuitry 35 is designed to provide an output voltage of +5 V a voltage will be produced at its output that is about 5 V higher than the potential of the ground connection and therefore is about 5 V higher than the output voltage of the high-precision operational amplifier 9 or 10. This voltage is provided to the positive power supply voltage terminal of the respective operational amplifier 9 or 10. Analogously, the voltage stabilizing circuitry 36 will generate a voltage V− that is about 5 V under the output voltage of operational amplifier 9 or 10. This voltage is provided as a negative output voltage for the respective operational amplifier 9 or 10. The input and output terminals of the operational amplifier 9 or 10 as per FIGS. 2a and 2b are identified with the letters E (for input) and A (for output).

The second critical design element, which, in addition to the operational amplifiers, determines the linearity of the V/I converter 3, is resistor 30. Resistor 30 is arranged so that the heat it generates does not cause any significant change in its operating temperature while performing the cycle of the four measurements. Resistor 30 should advantageously be composed by several resistors sharing the total dissipation.

Even if resistor 30 acts non-linearly, the concept of the invention still maintains an advantage over current solutions because only the linearity of a single resistor 30 affects the linearity of V/I convertor 3. Alternatively with prior art current circuitry designs that utilize instrumentation amplifiers, many resistors affect linearity.

FIG. 3 shows one configuration of the analog/digital converter 6 according to the present invention. Analog/Digital convertor 6, controlled by the control signals 6' through 9' and their binary complements 6' through 8' converts the current Ib into a number by counting pulses from the clock generator 4 in the control and analysis logic circuit 5 controlled by the binary signals SE and CB. An integrated A/D converter is used in the current domain because of its substantially larger dynamic range in comparison to voltage converters.

The current Ib is input into the negative terminal of operational amplifier via switch 16 controlled by control signal 6'. The terminals of an integrating capacitor 38 are coupled to the negative terminal and output terminal of operational amplifier 37. The operational amplifier 37 and capacitor 38 constitute an inverting integrator with the summing point being the negative terminal of operational amplifier 37. Capacitor 38 can be short-circuited by switch 19 controlled by control signal 9'. Furthermore, a compensating current Icb can be obtained from the summing point (negative terminal of operational amplifier 37) through switch 17 controlled by control signal 7' and through current source 39, and a magnifying current Is1 can be obtained from the negative terminal of operational amplifier 37 and pass through switch 18 controlled by control signal negative 8' (−8) and current source 40 to a negative power supply voltage V− (e.g. −30 V).

To keep the heat flow on the chip of the operation amplifier 37 constant during the cycle of four conversions, the imaging current and the compensating currents flow continuously into the output terminal of operational amplifier 37, either directly through switches 26, 27 and 28 or via the integrating capacitor 38 through switches 16, 17 and 18. The positive input to the operational amplifier 37, which is the reference point of the inverting integrator, is coupled to an initial reference voltage of −10 V.

The output of the operational amplifier is provided to the positive inputs of the two comparators 41 and 42 whose negative inputs have a reference voltage of −10 V and −10.1 V, respectively, and which generate the logic output signals SE and CB at their outputs.

Figure 4:
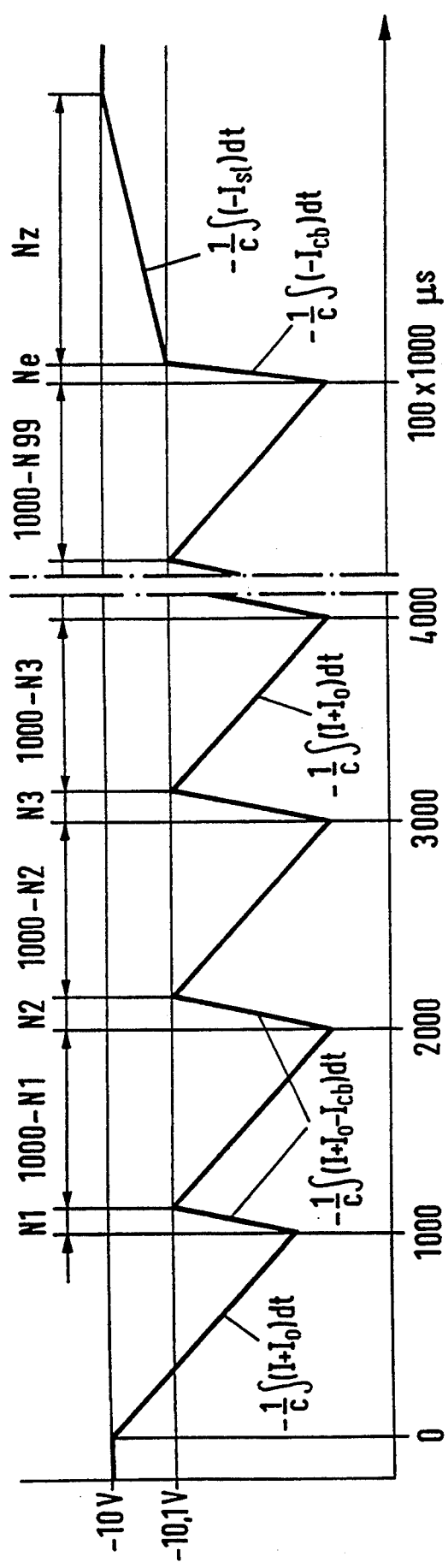
FIG. 4 is a time diagram showing operation of the analog/digital converter.

The operation of A/D converter 6 is described through FIG. 4 which depicts a time flow diagram of the integrator's output voltage during a complete conversion cycle.

Before the conversion begins, switch 19 is closed by control signal 9', and thus the integration capacitor 38 is discharged. Hence, the output of the operating amplifier has the same potential of −10 V as the positive input.

During the first sub-period (out of a total of 100 such sub-periods for a complete conversion cycle), switches 17, 18 and 19 are open and switch 16 is closed. The integrator integrates the imaging current Ib=I+Io and the output voltage of the integrator decreases in relation to the assigned integral. This sub-period lasts 1000 μs in the described explanation of the converter, which corresponds to the 1000 timing periods of a central control clock. It is desireable that all the circuitry operations be synchronized with this clock. A measuring period is made up of 100 sub-periods.

The subsequent 99 sub-periods then occur, whereupon switch 16 is conducting continuously and switch 17 is closed at the beginning of each sub-period. This is done by activating control signal 7, that, like all of the other control signals, is generated in the control and command logic circuit 5, and, for example, is transmitted opto-electronically or through transformers to the circuits. When switch 17 is closed, not only is the imaging current integrated, but also the corresponding compensating current Icb is integrated. By doing this, the output voltage increases. Once the output voltage has reached the second reference voltage −10.1 V after the N1 group of timing periods (corresponding to N1 μs), the control and command logic circuit 5 passes this information using output signal CB via an optical-electronic means of transmission. This reverses control signal 7', so that switch 17 is opened and remains open for the rest of the sub-period and the output voltage again drops in conformity with the integral of the imaging current. At the beginning of the next (third) sub-period, switch 17 again is closed during the N2 group of timing periods, but as soon as the output reaches the reference voltage of −10.1 V, it is opened up upon the beginning of the next timing period and remains open until the end of the sub-period. The above process repeats until the hundredth sub-period containing timing period group N99 is completed.

At the end of the last (100th) sub-period switch 17 is again closed, while switch 16 is again opened, and compensating current Icb stays integrated long enough until the reference voltage reaches −10.1 V after an Ne group of timing periods. As soon as comparator 42 has switched on and generated output signal CB, after the next timing period, the compensating current source is switched off by switch 17 opening, and a magnifying current source Is2 is activated with the closing of switch 18. Thus, the output voltage of the integrator again starts to increase slowly until the integrating capacitor 38 is discharged after Nz of further timing periods. The output thereby attains the reference voltage of −10.0 V and the comparator 41 switches on to generate output signal SE. Thus a conversion cycle has been completed. Until the beginning of the next conversion cycle, the integrating capacitor remains discharged by switch 19 remaining closed.

The charge balance for the integration summing point (negative terminal of operational amplifier 37) is achieved during a complete conversion cycle as follows wherein $$N1+N2+\ldots+N99=N{:}(I+Io)*1000+N*(I+Io-Icb)+(99*1000-N)*(I+Io)+Ne*(-Icb)+Nz*(-Is1)=0 \quad (3)$$

or solved for I+Io:

$$(I+Io)*100{,}000 = Icb*(N+Ne) + Is1*Nz, \quad (4)$$

and by setting Is1=Icb/128, one gets:

$$(I+Io)*100{,}000 = Icb*(N+Ne+Nz/128) \text{ or} \quad (5)$$

$$(I+Io)*100{,}000 = Is1*(128*(N+Ne)+Nz). \quad (6)$$

The solution can be calculated rather simply in the control and command logic circuit 5, where in one integration the individual N and then Ne, which are given a factor 128, and Nz can be summed up. The final integration ends as a multiple of the transposed Io imaging current I+Io taken to the hundred thousandth of the magnifying current.

By using the magnifying current, the basic resolution of 1/100,000 is improved by more than a factor of $10^{-2}$ and so a relative error of approximately $10^{-7}$ (100 pA/1 mA) is achieved.

Since the A/D converter uses only current switches, which can be fabricated relatively easily with an exceptional blocking ability and whose voltage errors do not falsify the current being put through it, the A/D converter can perform more efficiently than converters operating in the voltage domain.

Although the preferred embodiment of this invention has been described, it will be obvious to those skilled in the art that various changes and modifications may be made therein without departing from the invention. Therefore, the claims are intended to include all such changes and modifications that fall within the true spirit and scope of the invention.

What is claimed is:

1. A method for using a difference in characteristics between a measuring resistor and a reference resistor for determining a characteristic of the measuring resistor, comprising the steps of:

passing a first current through a measuring resistor in a first direction, and measuring a first value relating to a resulting first voltage across the measuring resistor based only on said first current passing through only said measuring resistor, and through no other resistors;

subsequently passing a second current through the measuring resistor in a second direction opposite to said first direction, and measuring a second value relating to a resulting second voltage across the measuring resistor based only on said second current passing through only said measuring resistor, and through no other resistors;

subsequently passing said first current through a reference resistor only in said first direction and measuring a third value relating to a resulting third voltage across the reference resistor based only on said first current passing through only said reference resistor, and through no other resistors;

subsequently passing said second current through the reference resistor only in said second direction and measuring a fourth value relating to a resulting fourth voltage across the reference resistor based only on said second current passing through only said reference resistor, and through no other resistors;

determining a first difference between the first value and the second value;

determining a second difference between the third value and the fourth value;

determining a quotient of the first difference and the second difference to produce a value signal; and using the value signal to determine the characteristic of at least one of the measuring resistor and the environment.

2. A method, employing the difference in characteristics between a measuring resistor and a reference resistor, for determining a characteristic of the measuring resistor, comprising the steps of:

first passing a first current through a measuring resistor in a first direction and generating a first imaging current proportional to a resulting first voltage across the measuring resistor;

second passing a second current through the measuring resistor in a second direction and generating a second imaging current proportional to a resulting second voltage across the measuring resistor;

third passing a third current through a reference resistor in the first direction, and generating a third imaging current proportional to a resulting third voltage across the reference resistor;

fourth passing a fourth current through the reference resistor in the second direction and generating a fourth imaging current proportional to a resulting fourth voltage across the reference resistor;

adding an offset current to each of the first, second, third and fourth imaging currents;

converting each of the first, second, third and fourth imaging currents, after said adding step, into first, second, third and fourth digital signals, respectively; and determining the characteristic of at least one of the measuring resistor and the environment in accordance with the first, second, third and fourth digital signals.

3. A method as claimed in claim 2, wherein the determining step comprises the steps of:

determining a first difference between a first value represented by the first digital signal and a second value represented by the second digital signal;

determining a second difference between a third value represented by the third digital signal and a fourth value represented by the fourth digital signal; and determining a quotient of the first difference and the second difference, the quotient proportionally representing the value of the measurable quantity.

4. A method, employing the difference in characteristics between a measuring resistor and a reference resistor, for determining a characteristic of the measuring resistor comprising the steps of:

first passing a first current through a measuring resistor in a first direction and generating a first imaging current proportional to a resulting first voltage across the measuring resistor;

second passing a second current through the measuring resistor in a second direction and generating a second imaging current proportional to a resulting second voltage across the measuring resistor;

third passing a third current through a reference resistor in the first direction and generating a third imaging current proportional to a resulting third voltage across the reference resistor;

fourth passing a fourth current through the reference resistor in the second direction and generating a fourth imaging current proportional to a resulting fourth voltage across the reference resistor;

converting each of the first, second, third and fourth imaging currents into first, second, third and fourth digital signals, respectively; and determining the characteristic of the measuring resistor in accordance with the first, second, third and fourth digital signals, wherein the converting step comprises the following steps for converting each of the first, second, third and fourth imaging currents;

defining a predetermined measuring period of time;

dividing the predetermined measuring period into a plurality of sub-periods of time;

integrating from an initial integral value onward a respective one of the first, second, third and fourth imaging currents during a first one of the sub-periods;

performing the following steps during each of the remaining plurality of sub-periods;

adding a compensating current to the respective one of the first, second, third and fourth imaging currents to produce a sum current;

integrating the sum current to produce a first integrated value until the first integrated value equals a predetermined value and outputting a first output signal when the first integrated value equals the predetermined value; and integrating a respective one of the first, second, third and fourth imaging currents to produce a second integrated value until the end of the sub-period;

integrating the compensating current after the last one of the sub-periods is completed to produce a third integrated value until the third integrated value equals the predetermined value;

producing a magnifying current after the third integrated value equals the predetermined value; and integrating the magnifying current to produce a fourth integrated value until the fourth integrated value equals the initial integral value and outputting a second output signal when the fourth integrated value equals the initial integral value;

the first, second, third and fourth digital signals being generated by the first output signals and the second output signal produced during converting of the respective first, second, third and fourth imaging currents.

5. An apparatus for determining a characteristic of a measuring resistor comprising:

a reference resistor;

means for alternately providing a plurality of currents through the measuring resistor and the reference resistor to produce a plurality of voltages, respectively, across the measuring resistor and the reference resistor and outputting a plurality of imaging currents relating to the voltages;

means for converting the imaging currents to digital signals, said converting means including:

a voltage/current transformer and an analog/digital converter, said voltage/current transformer including two operational amplifiers both configured as voltage followers, inputs of the voltage followers being connected to receive voltages across the measuring and reference resistors;

a resistor, connecting outputs of said two operational amplifiers to one another;

a transistor connected to receive an output voltage of one of said voltage followers, said one of said voltage followers being connected to a power source to generate a unipolar imaging current; and means for controlling the providing means and the converting means and generating, in accordance with the digital signals, a value signal representing the characteristic of at least one of the measuring resistor and the environment.

6. An apparatus for determining a characteristic of a resistor comprising:

a measuring resistor;

a reference resistor;

means for alternately providing a plurality of currents through the measuring resistor and the reference resistor to produce a plurality of voltages, respectively, across the measuring resistor and the reference resistor and outputting a plurality of imaging currents relating to the voltages;

means for converting the imaging currents to digital signals; and means for controlling the providing means and the converting means and generating, in accordance with the digital signals, a value signal representing the characteristic of at least one of the measuring resistor and the environment;

the plurality of currents comprises first, second, third and fourth currents; and the plurality of voltages comprises first, second, third and fourth voltages; and the providing means comprises:

first means for providing the first current through the measuring resistor in a first direction to produce the first voltage across the measuring resistor;

second means for providing the second current through the measuring resistor in a second direction to produce the second voltage across the measuring resistor;

third means for providing the third current through the reference resistor in said first direction to produce the third voltage across the reference resistor;

fourth means for providing the fourth current through the reference resistor in said second direction to produce the fourth voltage across the reference resistor; and means for producing first, second, third and fourth measuring currents in accordance with the first, second, third and fourth voltages, respectively, wherein:

the imaging currents comprise first, second, third and fourth imaging currents; and the providing means further comprises means for adding an offset current to the first, second, third and fourth measuring currents to produce the first, second, third and fourth imaging currents.

7. An apparatus as claimed in claim 6, wherein:

the plurality of currents comprises first, second, third and fourth currents; and the plurality of voltages comprises first, second, third and fourth voltages; and the providing means comprises:

first means for providing the first current through the measuring resistor in a first direction to produce the first voltage across the measuring resistor;

second means for providing the second current through the measuring resistor in a second direction to produce the second voltage across the measuring resistor;

third means for providing the third current through the reference resistor in the first direction to produce the third voltage across the reference resistor;

fourth means for providing the fourth current through the reference resistor in the second direction to produce the fourth voltage across the reference resistor; and means for producing first, second, third and fourth measuring currents in accordance with the first, second, third and fourth voltages, respectively.

8. An apparatus for determining a characteristic of a measuring resistor comprising:

a reference resistor;

means for alternately providing a plurality of currents through the measuring resistor and the reference resistor to produce a plurality of voltages, respectively, across the measuring resistor and the reference resistor and outputting a plurality of imaging currents relating to the voltages;

means for converting the imaging currents to digital signals; and means for controlling the providing means and the converting means and generating, in accordance with the digital signals, a value signal representing the characteristic, wherein:

the controlling means provides control signals to the converting means; and the converting means comprises:

means for producing a compensating current and a magnifying current in accordance with the control signals; and means for integrating, in accordance with the control signals, the magnifying current and at least one of the imaging currents and the compensating current to generate the digital signals.

9. An apparatus as claimed in claim 8, wherein:

the imaging currents comprise first, second, third and fourth imaging currents;

the plurality of voltages comprises first, second, third and fourth voltages; and the digital signals comprise first, second, third and fourth digital signals relating to the first, second, third and fourth imaging currents, respectively, and representing first, second, third and fourth values relating to the first, second, third and fourth voltage, respectively; and the controlling means comprises means for:

a) determining a first difference between the first and second digital signals;

b) determining a second difference between the third and fourth digital signals; and c) determining a quotient of the first difference and the second difference to produce the value signal.

10. The apparatus according to claim 5 wherein the measuring and reference resistors are connected to a ground potential at a connecting point therebetween.

11. The apparatus according to claim 1, wherein said first current is produced by a first current source and said second current is produced by a second, separate current source.

* * * * *